US006803655B2

(12) United States Patent
Fujio et al.

(10) Patent No.: US 6,803,655 B2
(45) Date of Patent: Oct. 12, 2004

(54) SEMICONDUCTOR INTEGRATED CIRCUIT DEVICE WITH EMI PREVENTION STRUCTURE

(75) Inventors: Shohhei Fujio, Machida (JP); Hideki Kabayama, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,131

(22) Filed: Jul. 25, 2001

(65) Prior Publication Data

US 2002/0020915 A1 Feb. 21, 2002

(30) Foreign Application Priority Data

Aug. 8, 2000 (JP) ........................................ 2000-239963

(51) Int. Cl.[7] ............................................. H01L 23/34
(52) U.S. Cl. .................... 257/724; 257/787; 257/723; 257/924; 257/516; 257/532; 361/729; 361/730; 174/50; 174/51
(58) Field of Search ................................. 257/723, 724, 257/787, 908, 532, 924, 68, 71, 516, 308, 307, 300, 298, 691, E23.079, E23.153; 361/729, 730; 174/50, 51

(56) References Cited

U.S. PATENT DOCUMENTS

| 4,734,818 A | * | 3/1988 | Hernandez et al. | ...... 361/306.2 |
| 5,283,717 A | * | 2/1994 | Hundt | ...................... 361/813 |
| 5,607,883 A | * | 3/1997 | Bhattacharyya et al. | .... 438/125 |
| 5,668,406 A | * | 9/1997 | Egawa | ........................ 257/690 |
| 5,804,874 A | * | 9/1998 | An et al. | ...................... 257/676 |
| 5,825,628 A | * | 10/1998 | Garbelli et al. | ............. 361/763 |
| 5,844,307 A | * | 12/1998 | Suzuki et al. | ................ 257/690 |
| 5,883,428 A | * | 3/1999 | Kabumoto et al. | .......... 257/691 |
| 6,330,164 B1 | * | 12/2001 | Khandros et al. | ............ 361/760 |
| 6,340,839 B1 | * | 1/2002 | Hirasawa et al. | ........... 257/672 |

FOREIGN PATENT DOCUMENTS

| JP | PUPA59-072757 | | 4/1984 |
| JP | 4277665 A | | 10/1992 |
| JP | PUPA04-130453 | | 11/1992 |
| JP | PUPA05-014015 | | 1/1993 |
| JP | PUPA07-263619 | | 10/1995 |
| JP | 8017960 | | 1/1996 |
| JP | PUPA08-148595 | | 6/1996 |
| JP | PUPA09-199666 | | 7/1997 |
| JP | 10070234 A | * | 3/1998 |
| JP | 11204699 A | * | 7/1999 |
| JP | PUPA2000-100983 | | 4/2000 |
| JP | PUPA2000-114723 | | 4/2000 |

* cited by examiner

*Primary Examiner*—Tom Thomas
*Assistant Examiner*—Chris C. Chu
(74) *Attorney, Agent, or Firm*—Anthony J. Canale

(57) ABSTRACT

A power lead and a ground lead are connected to corresponding pads of a die through an intra-package wiring substrate. A ground plane is formed in a mold under the intra-package wiring substrate extending along the bottom surface of the mold, and connected to the ground lead. A decoupling capacitor is connected to power wiring and the ground plane to prevent EMI caused by switching noise current generated by the power circuit of the die.

14 Claims, 7 Drawing Sheets

| Model | Cd | SG | Csd | Component |
|---|---|---|---|---|
| A | O | X | X | Cd |
| B | X | O | O | SG+Csd |
| C | O | O | O | SG+Csd+Cd |

SEMICONDUCTOR INTEGRATED CIRCUIT DEVICE WITH EMI PREVENTION STRUCTURE

BACKGROUND OF THE INVENTION

1. Field of the Invention

The present invention relates to a semiconductor integrated circuit device, an electric circuit device, electronic equipment, and control equipment in which countermeasures against EMI (electromagnetic interference) are taken. More specifically, the present invention relates to a semiconductor integrated circuit device, an electric circuit device, electronic equipment, and control equipment for preventing EMI caused by switching noise generated in the power circuit of a die.

2. Background

Simultaneous with the increase in the internal operating frequency and power consumption of semiconductor integrated circuit devices, EMI caused by the switching noise of the internal power circuit in semiconductor integrated circuit devices has raised serious problems. The switching noise current of the internal power circuit in semiconductor integrated circuit generates a loop current in an IC package, and a loop current circulating through the IC package and the PCB (printed circuit board) outside the IC package. These loop currents generate electromagnetic fields that radiate from the IC package and the PCB causing EMI in the surrounding environment.

One of the conventional countermeasures against the EMI of semiconductor integrated circuit devices is to place a decoupling capacitor between the power line and the ground line of the PCB. Although this conventional countermeasure can inhibit the radiation of electromagnetic fields from the PCB, it is difficult to inhibit the radiation of electromagnetic fields from the semiconductor integrated circuit device itself. Also, in order to prevent EMI caused by the entire PCB on which a large number of semiconductor integrated circuit devices are mounted, decoupling capacitors must be provided on the PCB to correspond to each power lead of each semiconductor integrated circuit device. As the number of decoupling capacitors on the entire PCB increases, problems arise such as increasing the size of the PCB, increasing the number of components on the PBC, and difficulty in finding locations to install decoupling capacitors on the PCB. Also, there is a case where an island-shaped ground plane is formed on the surface of a PCB that is covered with semiconductor integrated circuit devices in order to shield the electromagnetic fields radiated from the semiconductor integrated circuit devices. It is difficult, in this case, to form various wirings on the ground plane.

Japanese Published Unexamined Patent Application No. 4-277665 discloses a socket used for the tester of semiconductor integrated circuit devices. This socket comprises a contact fixed on the testing board for contacting and pressing the leads of semiconductor integrated circuit devices, an electrical conductor disposed so as to contact the ground pattern on the surface of the testing board, and a decoupling capacitor intervening between the contact and the electrical conductor. However, this structure is applied to the socket of a semiconductor integrated circuit device, and does not act to inhibit the switching noise current that is output from the semiconductor integrated circuit device. Also in this socket, since the electrical conductor contacts the ground pattern on the surface of the testing board two-dimensionally, and the impedance between the decoupling capacitor and the testing board is substantially lower than the impedance between the decoupling capacitor and the semiconductor integrated circuit device, the socket cannot inhibit the flow of the switching noise current leaked from the semiconductor integrated circuit device to the testing board.

In the semiconductor integrated circuit device disclosed in Japanese Published Unexamined Patent Application No. 8-17960, the bottom of the semiconductor integrated circuit device is formed of a ground plane, or from a central mounting plate and a circumferential power supply frame, and the ground plate and the power supply frame substitute for ground leads and power leads, thereby decreasing the number of leads on the side of the semiconductor integrated circuit device. Furthermore, in FIG. 4(b) of Japanese Published Unexamined Patent Application No. 8-17960, a power supply plane facing the ground plane is provided in the package of the semiconductor integrated circuit device, so that the power supply plane and the ground plane constitute a decoupling capacitor. In this semiconductor integrated circuit device, however, the ground plate and the power supply frame are directly and two-dimensionally in contact with the ground line and the power line of the PCB, and as a result, the impedance between the ground plane and the power supply frame, and the PCB is substantially lower than the impedance between the ground plane and the power supply frame, and the die. Further, the leakage of the noise current to the PCB cannot be sufficiently inhibited. In this semiconductor integrated circuit device, since the ground plane is used both as the path of the switching noise current returned from the die through the decoupling capacitor to the die in the package, and as the path of the return current of the transmission signal, ground-bound noise generated by the inductance of the ground plane cannot be inhibited. Furthermore, in this semiconductor integrated circuit device, since the center of the ground plane is protruded and the die is disposed on the protruded surface, problems such as an increase in capacitance of the internal circuit of the IC package, and degradation of the quality of the signal transmission in the die may occur.

BRIEF SUMMARY OF THE INVENTION

An object of the present invention is to provide a semiconductor integrated circuit device that can effectively inhibit EMI caused by a loop current circulating between the package and the printed circuit board for mounting electronic parts caused by the switching noise current of the internal power supply circuit in the semiconductor integrated circuit device.

Another object of the present invention is to provide a semiconductor integrated circuit device that can effectively inhibit EMI caused by a loop current in the package caused by the switching noise current of the internal power supply circuit in the semiconductor integrated circuit device.

Another object of the present invention is to provide a semiconductor integrated circuit device that does not require forming an island-shaped ground plane on the printed circuit board for mounting electronic parts for shielding the printed circuit board from the electromagnetic fields radiated by the semiconductor integrated circuit device.

Another object of the present invention is to provide an electric circuit device that can effectively inhibit EMI caused by semiconductor integrated circuit devices, and the printed circuit board for mounting electronic parts.

Another object of the present invention is to provide electronic equipment and control equipment furnished with semiconductor integrated circuit devices, and can effectively inhibit EMI.

A semiconductor integrated circuit device according to a first aspect of the present invention comprises:

- a die connected to a ground lead and a power lead,
- a ground plane extending two-dimensionally and connected to the ground lead,
- a decoupling capacitor connected to the ground lead at one end and to the power lead at another end, and
- an encapsulating material for encapsulating the die, ground plane, and decoupling capacitor.

When the surfaces of a semiconductor integrated circuit device facing the printed circuit board for mounting electronic parts and facing opposite to the printed circuit board for mounting electronic parts are defined as the bottom surface and the top surface, respectively, the ground plane is typically parallel to the top and bottom surfaces of the encapsulating material, but is not necessarily parallel The ground plane is preferably perpendicular to the direction in which the inhibition of electromagnetic radiation from the semiconductor integrated circuit device is desired. The ground plane is not limited to be flat, but may be curved, such as convex or concave toward the die. Although the number of the ground planes in a semiconductor integrated circuit device is typically one, when the semiconductor integrated circuit device has a plurality of power leads, multiple ground planes may be adequately dispersed depending on the distribution of power leads in the semiconductor integrated circuit device. When a semiconductor integrated circuit device has multiple ground planes, these ground planes may be in contact with each other, or they may be apart from each other and connected to the ground lead.

When a semiconductor integrated circuit device has multiple power leads, decoupling capacitors are not necessarily provided to all the power leads. The decoupling capacitors can be provided to specific power leads among all the power leads. When the decoupling capacitors are not provided to all the power leads, the decoupling capacitors can be provided to only the power leads of which switching noise voltages or currents are high. For example, when the semiconductor integrated circuit device is a CPU, it is preferable to provide decoupling capacitors focusing on the power leads of high-speed operation circuits (e.g., the CPU core, the PLL circuits, and the output buffer).

The capacitance of the decoupling capacitor is determined according to the frequency of switching noise voltages or currents generated in the power circuit of the die, and is in a range between several tens of pF and several Î¼ F. The frequency of electromagnetic fields that can most effectively inhibit EMI by allowing a decoupling capacitor to intervene between the ground plane and the power lead relates to the capacitance of the decoupling capacitor, as well as the inductance of the power lead. Therefore, the effect of inhibiting EMI can be improved by matching the capacitance of the decoupling capacitor and the inductance of the power lead to the frequency of switching noise voltages or currents generated in the power circuit.

The ground lead and the power lead act as a certain inductance against switching noise voltages generated in the power circuit of the semiconductor integrated circuit device. Therefore switching noise currents generated in the power circuit of the semiconductor integrated circuit device flow preferentially through the decoupling capacitor, the leakage of the switching noise currents to the printed circuit board for mounting electronic parts through the ground lead and the power lead is inhibited, and EMI from the wiring substrate for mounting is prevented. Also, the ground plane extending two-dimensionally shields electromagnetic fields radiated from the die, thereby attenuating the electromagnetic fields outwardly radiated from the semiconductor integrated circuit device.

According to the semiconductor integrated circuit device of a second aspect of the present invention, in the semiconductor integrated circuit device according to the first aspect of the present invention, the plane facing a printed circuit board for mounting electronic parts, and the plane facing opposite to the printed circuit board for mounting electronic parts, are defined as the bottom surface and the top surface, respectively; and the ground planes extend along the bottom surface.

When the package is a QFP (quad-flat package) or a DIP (dual inline package), the top surface and the bottom surface of the semiconductor integrated circuit device coincide with the top surface and the bottom surface of the mold. When the package is of a BGA (ball grid array) type, since a carrier PCB is further disposed on the bottom surface, the top surface of the semiconductor integrated circuit device coincides with the top surface of the mold, but the bottom surface of the semiconductor integrated circuit device coincides with the bottom surface of the carrier PCB.

Since the ground plane extends along the bottom surface of the semiconductor integrated circuit device, electromagnetic fields to be radiated from the semiconductor integrated circuit device toward the printed circuit board caused by the switching noise current is shielded by the ground plane, and EMI from the semiconductor integrated circuit device to the printed circuit board for mounting electronic parts is inhibited. Therefore, even if signal wirings are formed in the area of the printed circuit board for mounting electronic parts immediately underneath the semiconductor integrated circuit device, the adverse effect of the wirings on signals can be prevented.

According to the semiconductor integrated circuit device of a third aspect of the present invention, the ground planes extend two-dimensionally substantially throughout the bottom surface of the semiconductor integrated circuit device of the second aspect of the present invention.

When the package is a semiconductor integrated circuit device of, for example, a QFP or a DIP, the ground plane may be a plane without holes; however, when the package is a semiconductor integrated circuit device of, for example, a BGA, the lead must be passed through the ground plane. Therefore, holes for passing the lead are formed in the ground plane. The ground plane is extending in two dimensions over substantially the entire bottom surface of the semiconductor integrated circuit device which effectively prevents electromagnetic radiation at the bottom surface.

According to the semiconductor integrated circuit device of a fourth aspect of the present invention, an intra-package wiring substrate comprising wirings for the connecting path between leads and the bonding pads of the die is disposed between the die and the ground plane, and the decoupling capacitor is connected to the ground plane and the power line of the intra-package wiring substrate at either end in the semiconductor integrated circuit device of the third aspect of the present invention.

The decoupling capacitor can be mounted on the intra-package wiring substrate, thereby simplifying the structure for supporting the decoupling capacitor in the encapsulating material. The decoupling capacitor is preferably disposed at the location of the intra-package wiring substrate where the decoupling capacitor is easily connected to the power line of the intra-package wiring substrate.

According to the semiconductor integrated circuit device of a fifth aspect of the present invention, the portion of the encapsulating material for inserting the power lead is connected to the power supply bonding pad of the die through a bonding wire at the die-side end, and the decoupling capacitor is connected to the ground plane and the specified location of the portion for inserting the power lead at either end in the semiconductor integrated circuit device of the third aspect of the present invention.

The frequency of the switching noise current passing through the decoupling capacitor can also be adjusted by the inductance of the power lead. Therefore, by changing the location P1 for inserting the power lead that connects the power-lead-side of the decoupling capacitor, the inductance of the power lead from the connecting location P1 to the end P2 on the side of the printed circuit board for mounting electronic parts is changed, and the frequency of the electromagnetic fields can be adjusted within a desired range to prevent EMI very effectively.

According to the semiconductor integrated circuit device of a sixth aspect of the present invention, the specified location of the portion for inserting the power lead to which the decoupling capacitor is connected is the die-side end of the portion for inserting the power lead in the semiconductor integrated circuit device of the fifth aspect of the present invention.

The inductance from the location P1 of the portion for inserting the power lead for connecting the power-lead-side end of the decoupling capacitor to the location P2 of the power lead of the side of the printed circuit board for mounting electronic parts increases with increase in the length between P1 and P2. On the other hand, the higher the inductance between P1 and P2, the more difficult the current caused by the switching noise of the power circuit of the die to leak to the printed circuit board for mounting electronic parts through the power lead. Therefore, by establishing P1 at the die-side end of the portion for inserting the power lead, the inductance between P1 and P2 can be increased, and the switching noise current of the power circuit of the die is effectively prevented from leaking to the printed circuit board for mounting electronic parts through the power lead.

According to the semiconductor integrated circuit device of a seventh aspect of the present invention, the ground plane is connected to the die-side end of the portion for inserting the power lead into the encapsulating material in the semiconductor integrated circuit device of the fifth or sixth aspect of the present invention.

The inductance from the location P3 of the portion for inserting the ground lead for connecting the ground-lead-side end of the decoupling capacitor to the location P4 of the ground lead of the side of the printed circuit board for mounting electronic parts increases with increase in the length between P3 and P4. On the other hand, the higher the inductance between P3 and P4, the more difficult the switching noise current of the power circuit of the die to leak to the printed circuit board for mounting electronic parts through the power lead. Therefore, by establishing P3 at the die-side end of the portion for inserting the ground lead, the inductance between P3 and P4 can be increased, and the current caused by the switching noise of the power circuit of the die is effectively prevented from leaking to the printed circuit board for mounting electronic parts through the power lead.

According to the semiconductor integrated circuit device of an eighth aspect of the present invention, a layer of a material having a smaller dielectric constant than the dielectric constant of the encapsulating material is provided between the die or the intra-package wiring substrate and the ground plane in the semiconductor integrated circuit device of the first through seventh aspects of the present invention.

The material having a smaller dielectric constant than the dielectric constant of the encapsulating material is, for example, air. If the ground plane is disposed in the vicinity of the die or the intra-package wiring substrate, the capacitance between the signal line of the die or the intra-package wiring substrate and the ground plane will increase to degrade the quality of the signals. By disposing a layer having a small dielectric constant, such as a layer of air, between the die or the intra-package wiring substrate and the ground plane, the capacitance between the signal line of the die or the intra-package wiring substrate and the ground plane can be lowered.

The methods for adjusting the capacitance between the signal line of the die or the intra-package wiring substrate and the ground plane include disposing a layer having a small dielectric constant, as well as establishing the form of the ground plane to a specified curved surface, or providing one or more non-conducting portions partially on the ground plane.

The electric circuit device according to a ninth aspect of the present invention comprises, a semiconductor integrated circuit device according to any of first through eighth aspects of the present invention, a printed circuit board for mounting electronic parts whereon the semiconductor integrated circuit device is mounted, and an external decoupling capacitor provided on the printed circuit board for mounting electronic parts so as to be electrically connected in parallel with the decoupling capacitor of the semiconductor integrated circuit device.

The capacitance of the external decoupling capacitor is typically equal to the capacitance of the decoupling capacitor in the semiconductor integrated circuit device. However, the frequency range of EMI that can be prevented for the entire electric circuit device can be expanded by adequately differentiating the capacitance of the external decoupling capacitor from the capacitance of the decoupling capacitor in the semiconductor integrated circuit device.

Electronic equipment or control equipment according to a tenth aspect of the present invention comprises the semiconductor integrated circuit devices according to the first through eighth aspects of the present invention.

The electronic equipment includes computers, audio equipment, and communications equipment; the control equipment includes, for example, control devices equipped in motor vehicles or industrial machinery and equipment. The semiconductor integrated circuit device according to the present invention can not only be used in electronic equipment such as computers, audio equipment, and communications equipment, but also be incorporated in any equipment that requires countermeasures against EMI, such as the control devices for motor vehicles and industrial machinery and equipment.

DETAILED DESCRIPTION OF THE INVENTION

Description of the Preferred Embodiments

Figure 1:
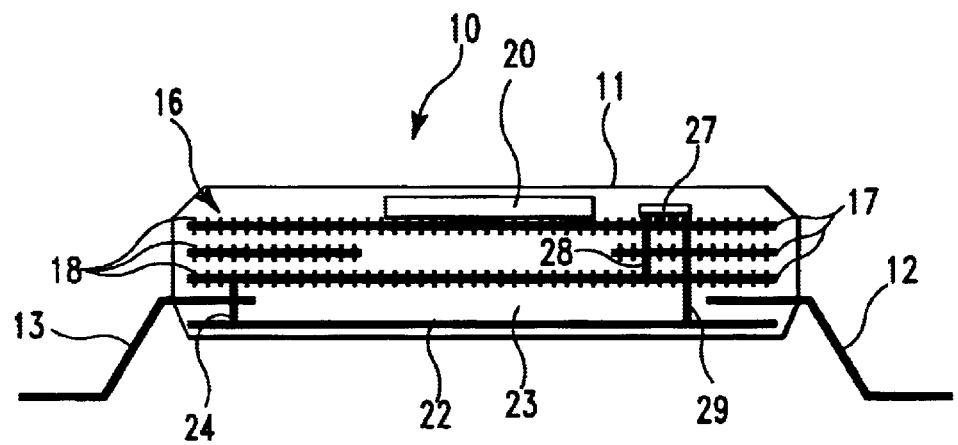
FIG. 1 is a schematic sectional view showing a QFP-type IC that includes a ground plane according to the present invention.

The preferred embodiments according to the present invention will be described below referring to the drawings.

FIG. 1 is a schematic sectional view showing QFP-type IC 10 that includes ground plane 22. Multiple leads including power leads 12 and ground leads 13 are protruded out of the lower ends of the four sides of mold 11 other than the top and bottom surfaces. The number of power leads 12 in entire QFP-type IC 10 is not limited to one, but normally is more than one. Intra-package wiring substrate 16 is composed of insulating layers 17 and wiring layers 18 disposed alternately, on which die 20 is placed. Each wiring layer 18 is provided with wiring for connecting each of leads including power lead 12 and ground lead 13 with corresponding pads on die 20. Ground plane 22 consists of a layer of metal such as copper, extends at a height slightly above the bottom surface of mold 11 along the bottom surface substantially over the entire bottom surface, and is connected to the end of ground lead 13 inserted into mold 11 through connecting line 24. Air layer 23 is formed between intra-package wiring substrate 16 and ground plane 22 in an area substantially extending over the entire area of ground plane 22, and restricts the capacitance between wirings in wiring layer 18 and ground plane 22 to a specific value. Decoupling capacitor 27 is fixed on the upper surface of uppermost wiring layer 18 of intra-package wiring substrate 16, of which power-supply-side connecting terminal line 28 is connected to the power line of specific wiring layer 18 of intra-package wiring substrate 16, and ground-side connecting terminal line 29 passes through intra-package wiring substrate 16 and is connected to ground plane 22.

Figure 2:
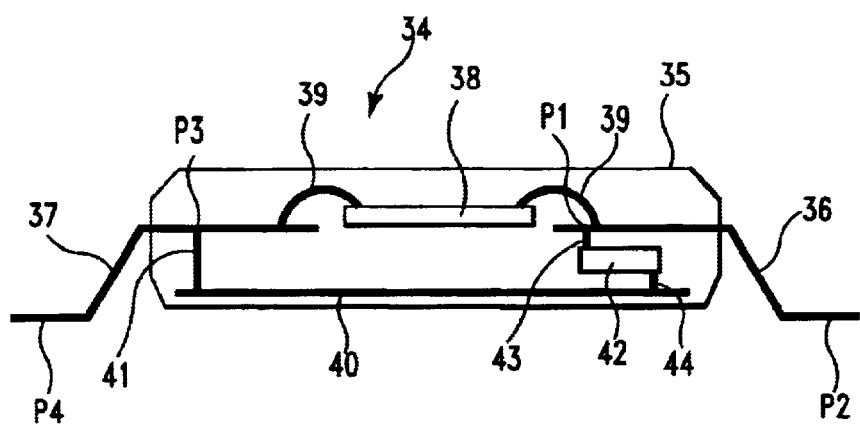
FIG. 2 is a schematic sectional view showing a DIP-type IC that includes a ground plane according to the present invention.

FIG. 2 is a schematic sectional view showing DIP-type IC 34 that includes ground plane 40. A plurality of leads including power leads 36 and ground leads 37 are protruded out of the lower ends of the two sides of DIP-type IC 34 extending in the length direction. The number of power leads 36 in entire DIP-type IC 34 is not limited to one, but normally is more than one. Die 38 is horizontally disposed in mold 35 at the central portion of both lateral and lengthwise directions of mold 35. The portions of all the leads including power leads 36 and ground leads 37 to be inserted into mold 35 reach sufficiently close to die 38, and die 38 side ends of the leads are connected to the corresponding bonding pads on die 38 through bonding wires 39. Ground plane 40 consists of a layer of metal such as copper, and extends along the bottom surface of mold 35 in parallel to and substantially over the entire bottom surface. Connecting line 41 extends in the vertical direction, and the upper and lower ends thereof are connected to the portion of lead 37 that is inserted into mold 35, and ground plane 40, respectively. The height of the portion of all the leads inserted into the mold is equalized in mold 35. Decoupling capacitor 42 is disposed in mold 35 at the height between the portion of power lead 36 inserted into mold 35 and ground plane 40, and connected to die 38-side end of the portion of power lead 36 inserted into mold 35 through power-supply-side terminal 43 and to ground plane 40 through ground-side terminal 44. Power lead 36 acts as inductance against the switching noise current of the power circuit of DIP-type IC 34, and the closer the connecting point P1 of power-supply-side terminal 43 to power lead 36, the higher the inductance from connecting point P1 to externally protruding end P2 of power lead 36. Therefore, by changing the location of connecting point P1, the inductance from connecting point P1 to externally protruding end P2 can be adjusted, and when connecting point P1 is closest to die 38, the inductance from connecting point P1 to externally protruding end P2 becomes highest. Similarly, the inductance between connecting point P3 of connecting line 41 to ground lead 37 and externally protruding end P4 of ground lead 37 becomes highest when connecting point P3 is closest to die 38.

Figure 3:
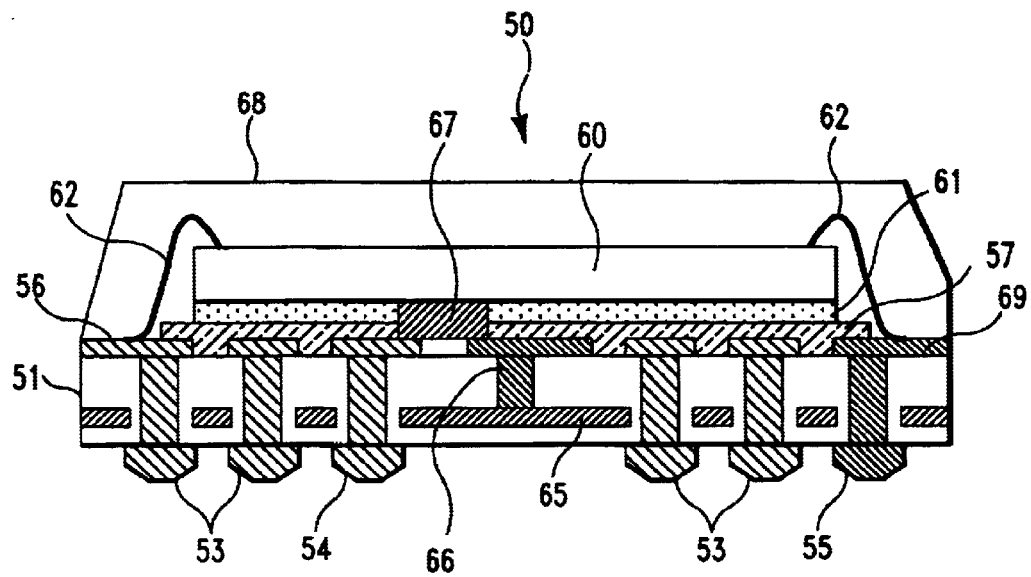
FIG. 3 is a schematic side view showing a BGA-type IC that includes a bonding plane according to the present invention.

FIG. 3 is a schematic sectional view showing BGA-type IC 50 that includes bonding plane 57. Multiple signal leads 53, at least one power lead 54, and one ground lead 55 are passed through carrier PCB 51 in the vertical direction. The lower ends are exposed out of the bottom surface of carrier PCB 51, and formed to be expanded shapes. The upper ends are exposed out of the upper surface of carrier PCB 51, and extend to the circumference of carrier PCB 51. Bonding layer 57 covers the upper surface of carrier PCB 51 so as to cover the area except the protruded end of each wire-connecting portion 56. Die 60 is placed on the upper surface of bonding layer 57 via an intervening mounting material layer 61. Bonding wire 62 connects each wire-connecting portion 56 to the corresponding bonding pad on die 60. Ground plane 65 consists of a layer of metal such as copper, and extends in two dimensions slightly above the bottom surface of carrier PBC 51 and throughout the entire bottom surface of carrier PBC 51 without exposing itself to the outer surface of carrier PBC 51. Furthermore, ground plane 65 avoids contact to signal lead 53, power lead 54, and ground lead 55. The lower end of connecting pin 66 contacts ground plane 65. The upper end of connecting pin 66 is not covered with bonding layer 57, and is connected to ground lead 55 on the upper surface of carrier PBC 51 through ground circuit 69. Decoupling capacitor 67 is disposed on the upper side of carrier PBC 51, and is connected to power lead 54 and connecting pin 66 at either end. Mold 68 is provided on the upper side of carrier PBC 51 so as to encapsulate each element of BGA-type IC 50 disposed on the upper side of carrier PBC 51.

Figure 4:
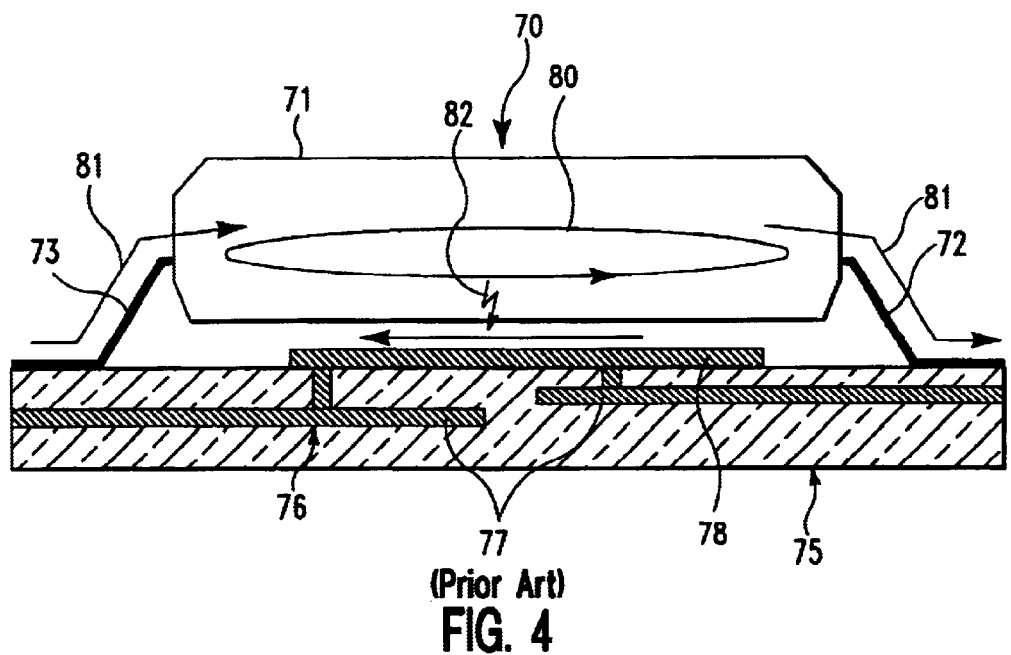
FIG. 4 is a diagram illustrating electromagnetic interference caused by a conventional IC.

FIG. 4 is a diagram illustrating electromagnetic interference caused by conventional IC 70. Multiple leads including power lead 72 and ground lead 73 are protruded out of the sides of package 71, and the leads are connected to corresponding wirings of PCB 75. Prescribed signal wirings 76 provided in PCB 75 have embedded portions 77 formed in PCB 75, and exposed portions 78 formed on the upper surface of PCB 75 below package 71. The switching noise current of the power circuit of the die in package 71 causes IC package loop current 80 to occur in package 71, and IC package leakage current 81 to leak from package 71 to PCB 75 through power lead 72, and to be returned to package 71 through ground lead 73. IC package loop current 80 causes electromagnetic fields 82 to radiate from the bottom of package 71, and exposed portions 78 of signal wirings 76 receive strong noise from electromagnetic fields 82. Therefore, IC 70 requires countermeasures against IC package leakage current 81 and electromagnetic fields 82 for preventing EMI. Decoupling capacitor 27 and ground plane 22 of QFP-type IC 10 of FIG. 1, decoupling capacitor 42 and ground plane 40 of DIP-type IC 34 of FIG. 2, and decoupling capacitor 67 and ground plane 65 of BGA-type IC 50 of FIG. 3 prevent the switching noise current from leaking externally. Ground plane 22 of QFP-type IC 10, ground plane 40 of DIP-type IC 34, and ground plane 65 of BGA-type IC 50 prevent the electromagnetic fields from radiating externally due to the loop current within the IC package. Thus, the electromagnetic radiation from QFP-type IC 10, DIP-type IC 34, and BGA-type IC 50, and the electromagnetic radiation from the PCB on which these ICs are mounted, can be prevented.

Figures 5, 6:
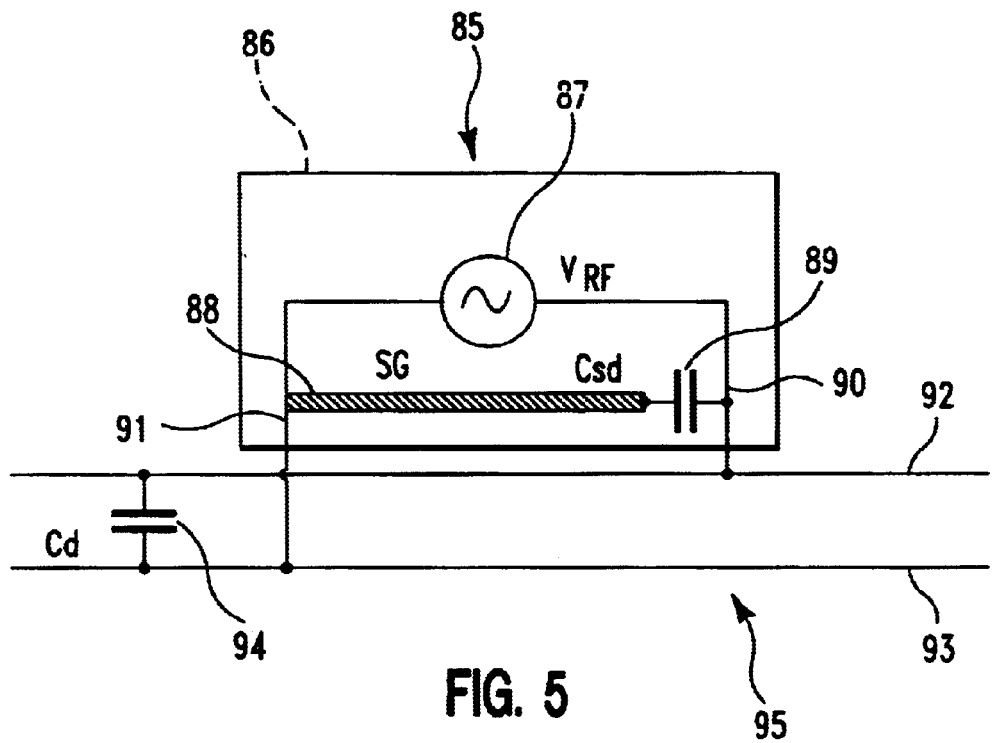
FIG. 5 is a circuit diagram showing components of an IC model selected by simulation for detecting the effect of electromagnetic interference.
FIG. 6 is a table showing the relationship between each simulation model and the components thereof.

FIG. 5 is a circuit diagram showing components of an IC model used for simulation for detecting the effect of electromagnetic interference. In IC model 85, RF noise source 87, ground plane 88, and decoupling capacitor 89 are encapsulated in package 86. Both ends of RF noise source 87 are connected to power plane 92 and ground plane 93 of PCB 95 through power lead 90 and ground lead 91, respectively. Ground plane 88 is disposed underneath RF noise source 87. One end of ground plane 88 is connected to power lead 90 through decoupling capacitor 89, and the other end of ground plane 88 is connected to ground lead 91. Power plane 92 and ground plane 93 are provided on PCB 95 on which ICs are mounted, and power plane 92 is disposed above ground plane 93. Decoupling capacitor 94 is disposed on PCB 95, and is connected to power plane 92 and ground plane 93 at either end.

Ground plane 88 in FIG. 5 corresponds to above-described ground plane 22 of QFP-type IC 10, ground plane 40 of DIP-type IC 34, and ground plane 65 of BGA-type IC 50. Decoupling capacitor 94 in FIG. 5 corresponds to above-described decoupling capacitor 27 of QFP-type IC 10, decoupling capacitor 42 of DIP-type IC 34, and decoupling capacitor 67 of BGA-type IC 50.

FIG. 6 is a table showing the relationship between each simulation model and the components thereof. Cd, SG, and Csd represent decoupling capacitor 94, ground plane 88, and decoupling capacitor 89 of FIG. 5, respectively, and o and x indicate whether these elements are provided in each model or not, respectively. Model A has only Cd of the three elements; model B has SG and Csd of the three elements; and, model C has all three elements.

Figure 7:
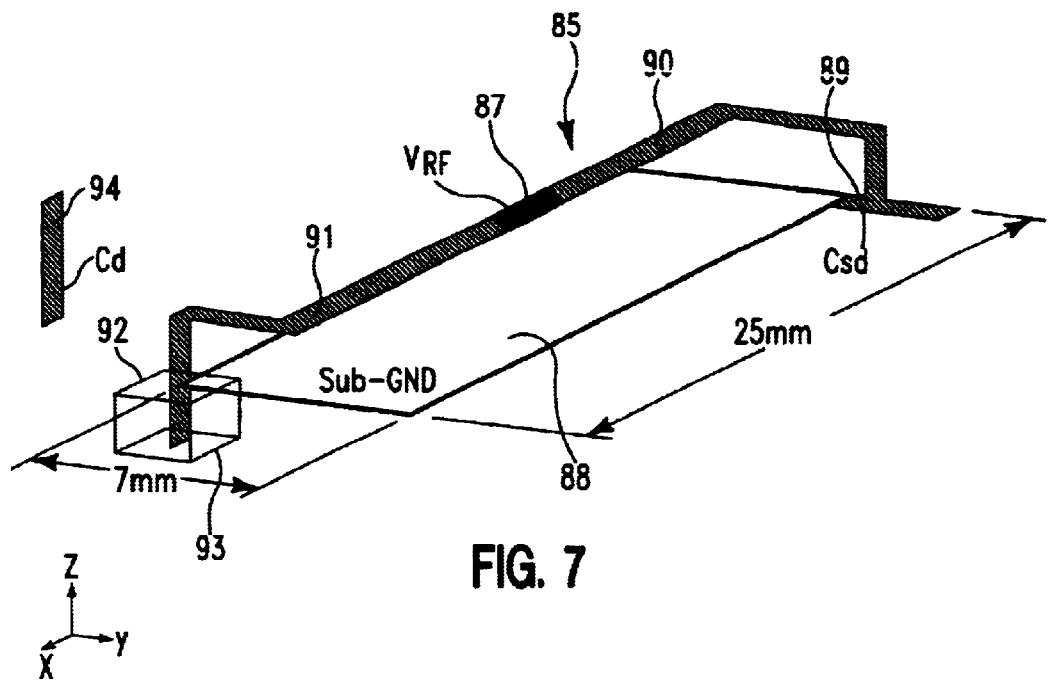
FIG. 7 is a diagram showing the dimensions in the simulation model.

FIG. 7 is a diagram showing the dimensions of the portion of IC model 85 in the simulation model. Reference numerals and characters for elements in FIG. 7 agree to the reference numerals and characters for the corresponding elements shown in FIG. 5, and models A, B, and C of FIG. 6 are DIP-type ICs. Decoupling capacitor 94 is disposed on the location apart from IC model 85.

Figure 8:
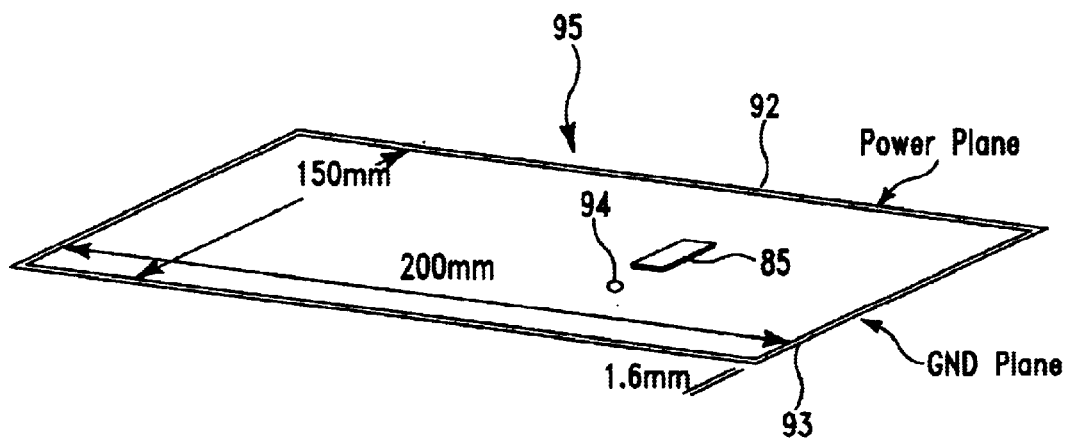
FIG. 8 is a diagram showing the dimensions in a PCB, together with the location of the IC model on the PCB.

FIG. 8 is a diagram showing the dimensions in PCB 95, together with the location of IC model 85 on PCB 95.

Specifications not shown in FIGS. 7 and 8 are as follows:

Cd os anpit 0.01 μF;

Csd is about 0.01 μF;

width of power lead 90 and ground lead 91 is about 1 mm;

RF noise source 87 is a sinusoidal wave voltage source of amplitude of about 1 V;

observation point and measured data is the maximum value of the electric field intensity vector at the spherical surface of a radius of 3 m from the model (free space);

specific dielectric constant between power plane 92 and ground plane 93 is Î μr of about 1.0 (air); and, assumptions for the simulation model: for the model having only the layers of power plane 92 and ground plane 93, the losses in wiring leads 90, 91, ground plane 88, power plane 92, and ground plane 93 are ignored.

Figure 9:
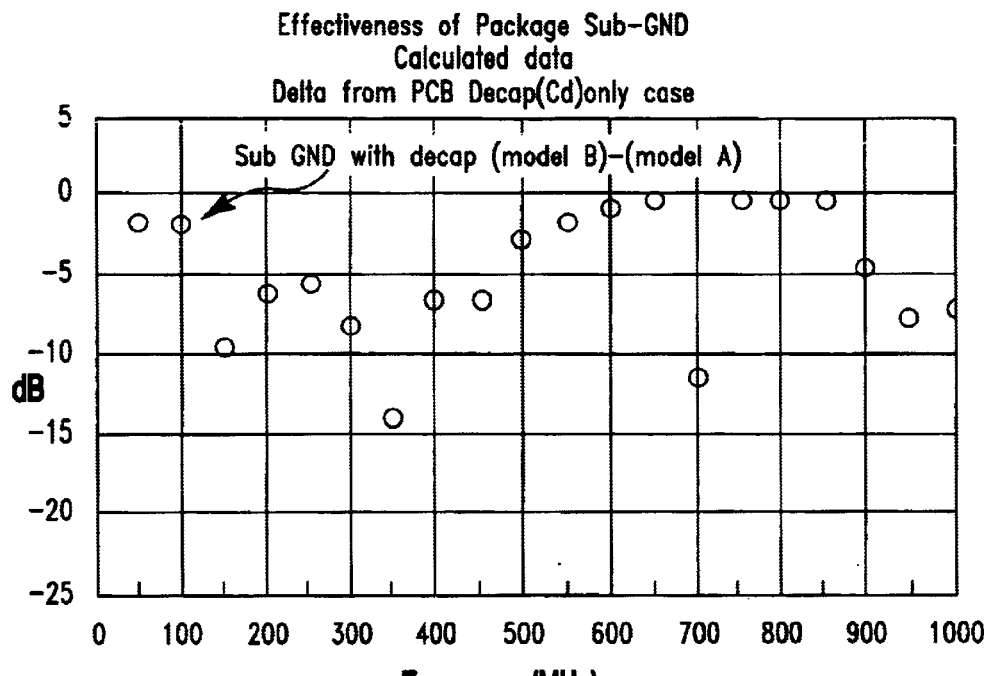
FIG. 9 is a graph showing difference between models B and A calculated based on the result of simulation.
Figure 10:
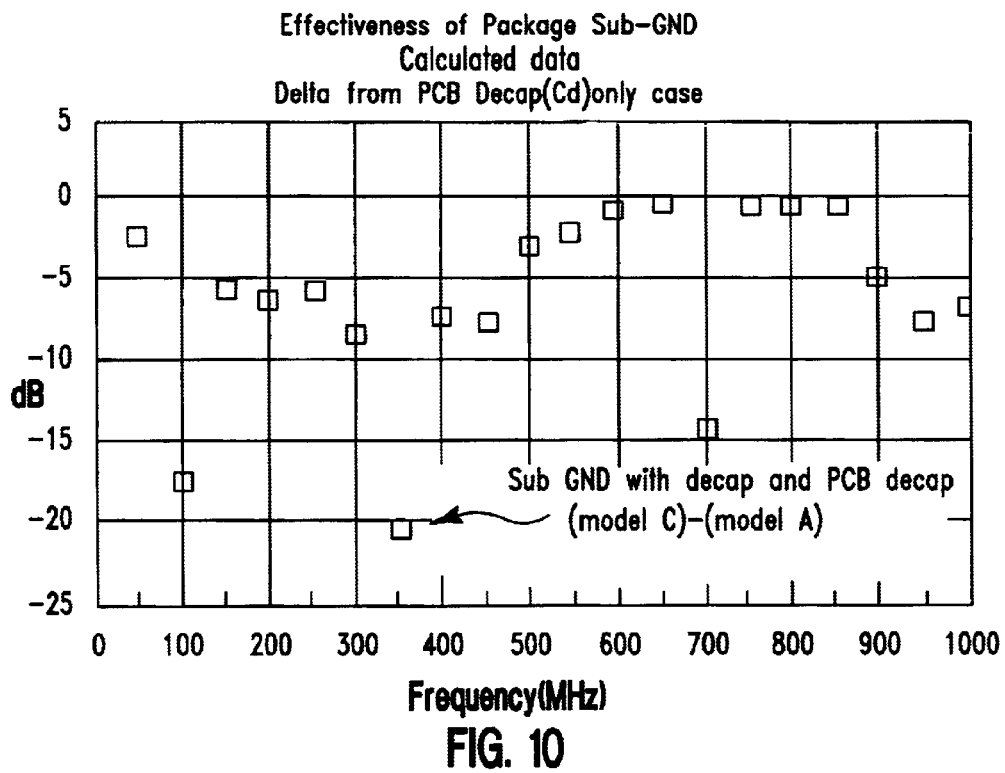
FIG. 10 is a graph showing difference between models C and A calculated based on the result of simulation.

FIG. 9 is a graph showing the difference between models B and A calculated based on the result of simulation. The x-axis shows the frequencies of RF noise source 87, and the y-axis shows the difference in the maximum values of electric field intensity vectors measured at the above-described observation point between models A and B (=the maximum value of the electric field intensity vector for the model B—the maximum value of the electric field intensity vector for the model A). It is known in model B, that EMI is prevented at frequencies of 150 MHz, 350 MHz, 700 MHz, or the like. In FIGS. 9 and 10, the frequencies at which EMI is prevented can be adjusted by varying the value of decoupling capacitor 89 (Csd). The frequencies at which EMI is prevented in above-described DIP-type IC 34 (FIG. 2) can also be adjusted by varying the inductance between the location of point P1 of power-supply-side terminal 43 for connecting to mold 35 and outer end P2 of power lead 36, by bringing the location of connecting point P1 closer to or further away from die 38.

FIG. 10 is a graph showing the difference between models C and A calculated based on the result of simulation. The x-axis shows the frequencies of RF noise source 87, and the y-axis shows the difference in the maximum values of electric field intensity vectors measured at the above-described observation point between models A and C (=the maximum value of the electric field intensity vector for model C—the maximum value of the electric field intensity vector for model A). In model C, decoupling capacitor 94 (Cd) is added to model B, and the electric field intensity at the bottom in FIG. 10 is lowered even further over the electric field intensity shown in FIG. 9. It is known from this that the countermeasures against EMI are further improved compared with the total of models A and B.

Figure 11:
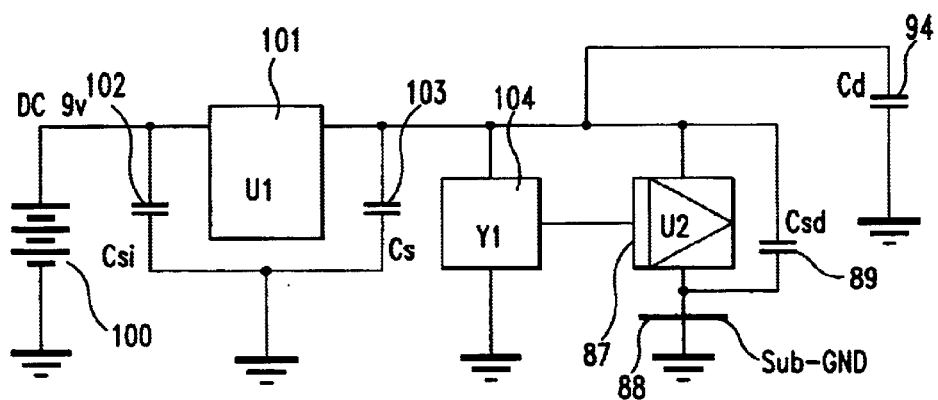
FIG. 11 is a diagram showing the circuit of an experimental model, together with the specification of the components thereof.

FIG. 11 is a diagram showing the circuit of an experimental model, together with the specifications of the components thereof. Reference numerals and characters for elements in this experimental model agree to the reference numerals and characters for corresponding elements shown in FIG. 5. The components newly added to the model of FIG. 11 will be described below. The positive voltage of +9 V DC power source 100 is inputted to +5 V constant-voltage regulator 101. Input-side capacitor 102 and output-side capacitor 103 are connected between the input terminal of constant-voltage regulator 101 and ground, and between the output terminal of constant-voltage regulator 101 and ground, respectively. Oscillator 104 is provided with +5 V voltage from constant-voltage regulator 101, generates a clock signal of 50.000 MHz, and supplies the clock signal to RF noise source 87. RF noise source 87 supplies the RF signals within a prescribed frequency range to the positive sides of decoupling capacitor 89 and decoupling capacitor 94, based on the frequency of the signal supplied from oscillator 104.

Figure 12:
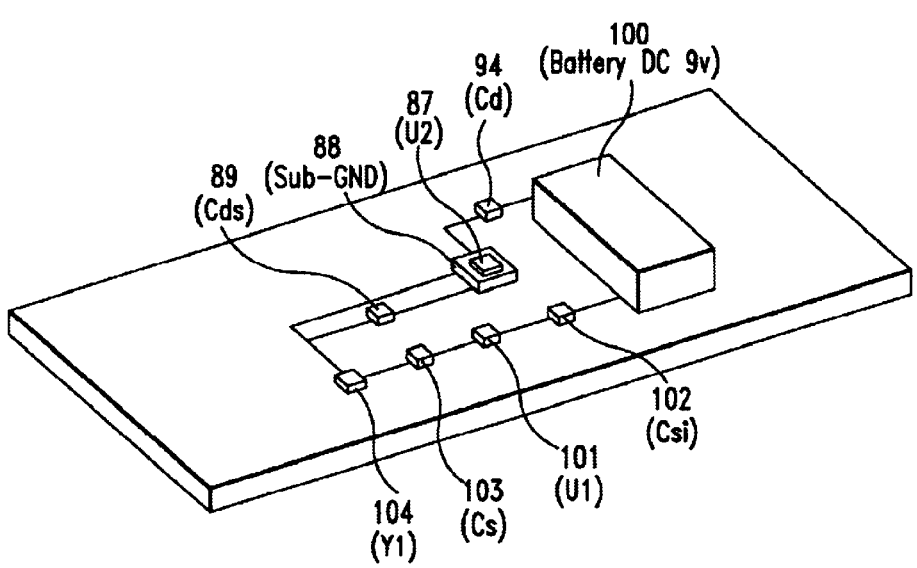
FIG. 12 is a perspective view showing an experimental model to which the circuit of FIG. 11 is applied.

FIG. 12 is a perspective view showing an experimental model to which the circuit of FIG. 11 is applied. The reference numerals and characters for elements in FIG. 12 agree with the reference numerals and characters for corresponding elements shown in FIG. 11.

Figure 13:
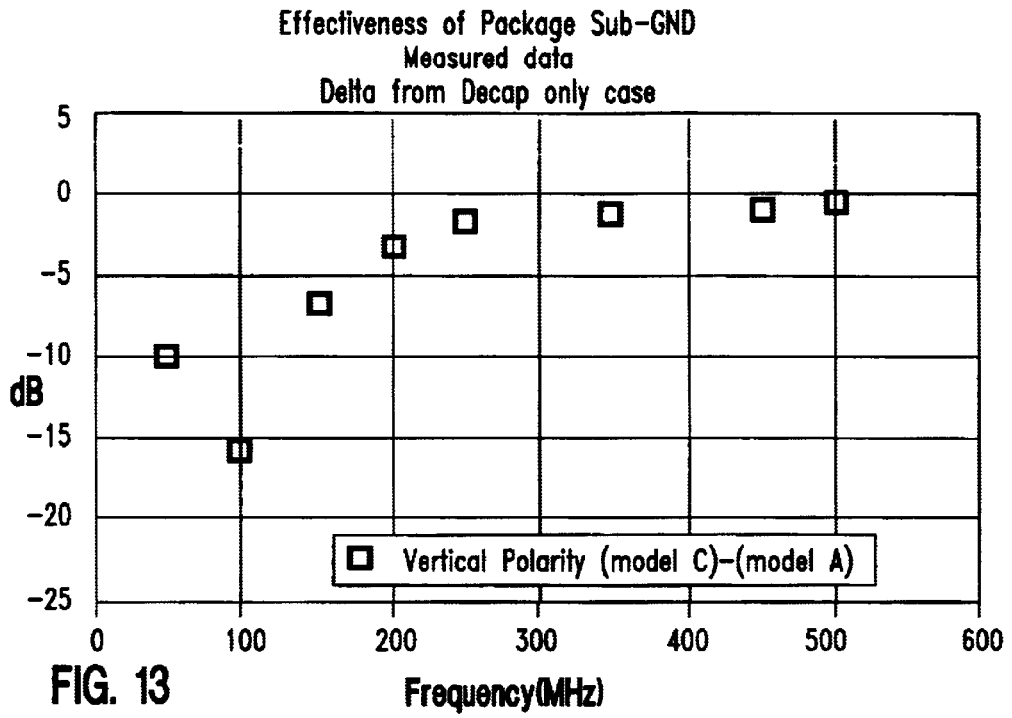
FIG. 13 is a diagram showing measured electric-field value data of vertically polarized waves received by an antenna disposed on a predetermined observing point in the experiment using the experimental model of FIG. 12.
Figure 14:
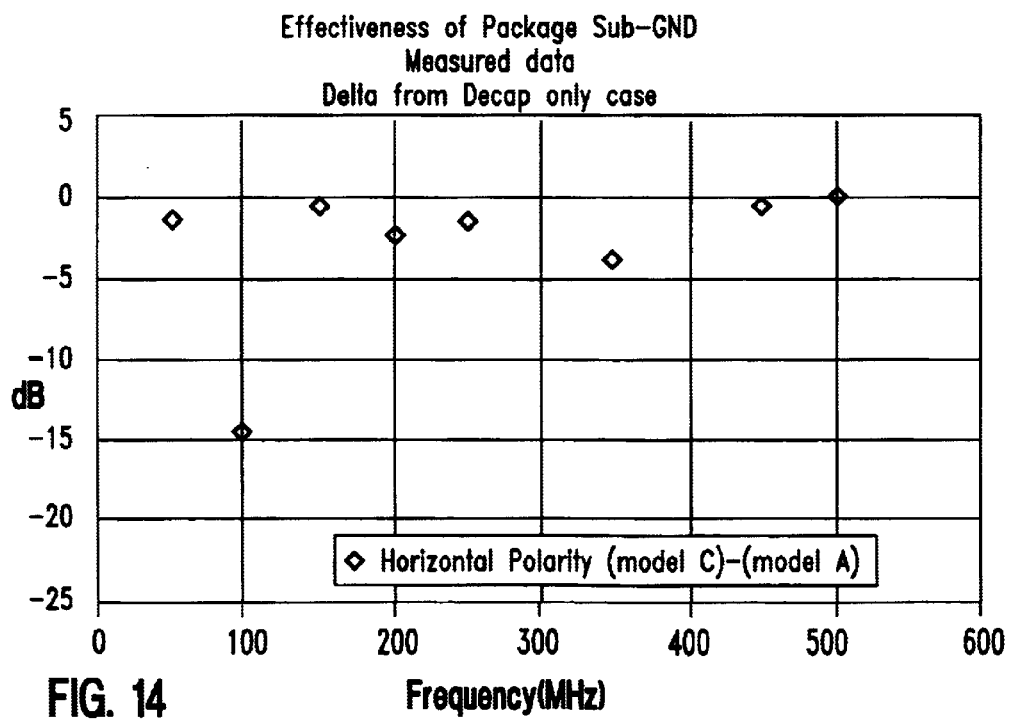
FIG. 14 is a diagram showing measured electric-field value data of horizontally polarized waves received by an antenna disposed on a predetermined observing point in the experiment using the experimental model of FIG. 12.

FIGS. 13 and 14 are diagrams showing measured electric-field intensity data of vertically polarized waves received by an antenna disposed on a predetermined observing point in the experiment using the experimental model of FIG. 12. In FIGS. 13 and 14, the x-axis shows the frequencies of RF noise source 87, and the y-axis shows the difference between the electric field intensity of models A and C in FIG. 6 at each frequency. The frequency observation point is a point of an antenna 10 m apart from the experimental model at a height of 2 m in an electromagnetic semi-anechoic chamber, and frequencies of vertically polarized waves and horizontally polarized waves were measured. Points of data below the observation limit are not shown. The numeric value of the calculated data shown in FIGS. 9 and 10 from the simulations show the electric field intensity in a free space (direct waves only), whereas the measured data shown in FIGS. 13 and 14 are the results of measurements taken in the electromagnetic semi-anechoic chamber, that is, the sum of direct waves and waves reflected from the metal surface of the floor of the semi-anechoic chamber. Due to the existence of such reflected waves, as well as difference in observation points, or the presence or absence of the dielectric, the data of the simulation model cannot be compared directly with the data of the experimental models. It is known from FIGS. 13 and 14 that both vertically polarized waves and horizontally polarized waves at prescribed frequencies were sufficiently lowered.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

What is claimed is:

1. A semiconductor integrated circuit device comprising:
   a die connected to a first end of a ground lead and a power lead;
   a ground plane connected to the ground lead, said ground plane extends beyond the first end of the ground lead;
   an electrically insulating layer which electrically isolates said die and said ground plane;
   a decoupling capacitor having a first end and a second end, the first end connected to the ground plane and the second end connected to the power lead; and
   an encapsulating material which encapsulates the die and the ground plane.

2. The semiconductor integrated circuit device according to claim 1, wherein said ground plane is adjacent a first plane of a printed circuit board for mounting electronic parts.

3. The semiconductor integrated circuit device according to claim 2, wherein said ground plane extends in two dimensions beyond the edges of said die.

4. The semiconductor integrated circuit device according to claim 3, wherein an intra-package wiring substrate comprising wirings for a connecting path between the ground and power leads, bonding pads of the die is disposed between the die and the ground plane, and the decoupling capacitor is connected to the ground plane at one end and the power line of the intra-package wiring substrate at the other end.

5. The semiconductor integrated circuit device according to claim 3, wherein the portion of the encapsulating material for inserting the power lead is connected to a power supply bonding pad of the die through a bonding wire at the die-side end, and the first end of the decoupling capacitor is connected to the ground plane and the second end of the decoupling capacitor is connected to the specified location of said portion for inserting the power lead.

6. The semiconductor integrated circuit device according to claim 5, wherein the specified location of the portion for inserting the power lead to which the decoupling capacitor is connected is the die-side end of the portion for inserting the power lead.

7. The semiconductor integrated circuit device according to claim 5, wherein the ground plane is connected to the die-side end of the portion for inserting the power lead into the encapsulating material.

8. The semiconductor integrated circuit device according to claim 1, wherein a layer of a material having a lower dielectric constant than the dielectric constant of the encapsulating material is provided between the die and the ground plane.

9. The semiconductor integrated circuit device according to claim 1, further comprising:
   a printed circuit board for mounting electronic parts whereon the semiconductor integrated circuit device is mounted; and
   an external decoupling capacitor provided on the printed circuit board electrically connected in parallel with the decoupling capacitor of the semiconductor integrated circuit device.

10. An electronic apparatus or control apparatus comprising a semiconductor integrated circuit device according to claim 1.

11. The semiconductor integrated circuit device according to claim 1, wherein the electrically insulating layer comprises one of air, encapsulating material or bonding material.

12. The semiconductor integrated circuit device according to claim 1, wherein the ground plane comprises a layer of metal.

13. The semiconductor integrated circuit device according to claim 12, wherein the layer of metal comprises copper.

14. The semiconductor integrated circuit device according to claim 1, wherein the encapsulating material encapsulates the decoupling capacitor and the electrically insulating layer.

* * * * *